United States Patent [19]

Goda et al.

[11] Patent Number: 5,336,365
[45] Date of Patent: Aug. 9, 1994

[54] POLYSILICON ETCHING METHOD

[75] Inventors: Hisashi Goda; Yasutoshi Asahina, both of Tokyo; Masayuki Hashimoto; Naoki Oka, both of Tateyama, all of Japan

[73] Assignee: Nippon Steel Semiconductor Corporation, Japan

[21] Appl. No.: 22,634

[22] Filed: Feb. 25, 1993

[30] Foreign Application Priority Data

Feb. 27, 1992 [JP] Japan .................. 4-041567

[51] Int. Cl.$^5$ .......................................... H01L 21/302
[52] U.S. Cl. .................... 156/643; 156/653; 156/657
[58] Field of Search ............... 156/653, 643, 646, 657, 156/659.1

[56] References Cited

U.S. PATENT DOCUMENTS

| | | | |
|---|---|---|---|
| 4,349,409 | 9/1982 | Shibayana et al. | 156/643 |
| 4,468,285 | 8/1984 | Bayman et al. | 156/643 |
| 4,799,991 | 1/1989 | Dockery | 156/643 |
| 5,013,398 | 5/1991 | Long et al. | 156/643 |
| 5,030,590 | 7/1991 | Amini et al. | 437/233 |
| 5,094,712 | 3/1992 | Becker et al. | 156/643 |
| 5,147,499 | 9/1992 | Szwejkowski et al. | 156/643 |
| 5,160,407 | 11/1992 | Latchford et al. | 156/656 |

*Primary Examiner*—T. N. Quach
*Attorney, Agent, or Firm*—Wegner, Cantor, Mueller & Player

[57] ABSTRACT

A method of etching a polysilicon film specimen by an electronic cyclotron resonance etching technique or a microwave plasma etching technique includes the first process in which a mixed gas containing $Cl_2$ and HBr is used as a process gas for etching, the $Cl_2$ occupying 50-70 vol. % of the whole mixed gas; and the second process in which a mixed gas containing HBr and He is used, with HBr being in a proportion of 20-50 vol. % of the mixed gas, and a low bias voltage from −100 to −30 volts is applied to a specimen carrier. Further, in the first and second processes, a mixed gas containing HBr and He is used, with HBr being in a proportion of 20-50 vol. %, and a relatively high bias voltage from −250 to −100 volts is applied to the specimen carrier in the first process, while a low bias voltage from −100 to −30 volts is applied to the same in the second process. According to the present invention, a polysilicon film can be etched without causing undercut and with high dimensional accuracy.

6 Claims, 2 Drawing Sheets

POLYSILICON ETCHING METHOD

BACKGROUND OF THE INVENTION

1. Field of the Invention

The present invention relates to a plasma etching method used for the manufacturing of semiconductor devices and so on, and more particularly to an electronic cyclotron resonance (ECR) etching technique or a microwave plasma etching technique (hereinafter these methods are collectively referred to as the "plasma etching method") which may be utilized in the field of the formation of gate structures and so on which needs to form a polysilicon film on a thin SiO$_2$ film of about 200 Angstrom or less with a good dimensional accuracy. More specifically, the present invention relates to a method for etching polysilicon where the underlying structures have vertical steps. Incidentally, it is assumed that the polysilicon includes both undoped polysilicon and doped polysilicon.

2. Description of the Related Art

Conventionally, in plasma etching method to form a polysilicon film on a silicon substrate with a good dimensional accuracy, FREON 113 (C$_2$Cl$_3$F$_3$) and a mixed gas containing this and a slight amount of sulfur hexafluoride (SF$_6$) are used as a process gas. In recent years, C$_2$Cl$_3$F$_3$ is believed to cause the destruction of the ozone layer, so that its use tends to be prohibited. As a material substituting for C$_2$Cl$_3$F$_3$, chlorine or a process gas containing chlorine and a slight amount, i.e., 10 vol. % or less of SF$_6$ is used.

However, the above-mentioned etching methods have the following problems:

The method using C$_2$Cl$_3$F$_3$ has an environmental problem of damaging the ozone layer in the stratosphere as described above. Further, since the etchrate selectivity (i.e. the etchrate of polysilicon: etchrate of SiO$_2$) is only about 20:1, the underlying SiO$_2$ film may be damaged or completely removed.

In the etching method using chlorine, when overetching is performed, the profile shape of a polysilicon film having mask 12 thereon is gradually tapered with a re-entrant profile, as shown in FIG. 1, which results in deterioration of dimensional accuracy. This re-entrant profile makes observation and evaluation using a scanning electron microscope (SEM) difficult. Further, undercut of the polysilicon film 11 may result in a notch 15, as shown in FIG. 2, which sometimes results in a crucial defect. This notch is believed to occur due to chlorine ions and chlorine radicals attaching to the polysilicon side wall and etching the polysilicon.

On the other hand, the etching method using a process gas containing chlorine and SF$_6$ may give rise to undercut due to isotropic etching. When a photoresist mask is used as a mask, anisotropic etching is somehow achieved by a side wall protection of the photoresist if SF$_6$ flow rate is reduced to about 5% or less of the chlorine flow rate, with the result that a substantially vertical polysilicon film side wall is formed. However, when a SiO$_2$ mask is used as a mask, a side wall protecting material is not present so that undercut advances to a remarkable extent. This method, thus, cannot be applied to a polysilicon film with a line width of about 0.5 micron or less.

SUMMARY OF THE INVENTION

It is therefore an object of the present invention to provide an anisotropic etching method for polysilicon films which does not cause undercut and is excellent in dimensional accuracy.

According to the present invention, a method of etching a polysilicon by a plasma etching method is characterized by comprising a first process which uses a mixed gas containing Cl$_2$ and HBr as a process gas for etching, where Cl$_2$ occupies 50-70 vol. % of the whole mixed gas; and a second process which uses a mixed gas containing HBr and He, where HBr occupies 20-50 vol. % of the whole mixed gas, and applies a bias voltage from $-100$ to $-30$ volts to a specimen carrier (hereinafter referred to as the "first method").

Further, according to the present invention, a method of etching a polysilicon by a plasma etching method is characterized by comprising a first process which uses a mixed gas containing HBr and He, where the HBr is used in a proportion of 20-50 vol. % of the mixed gas, and a relatively high bias voltage from $-250$ to $-100$ volts is applied to a specimen carrier; and a second process in which a low bias voltage from $-100$ to $-30$ volts is applied to the specimen carrier (hereinafter referred to as the "second method").

In the second method of the present invention, at the beginning of the first process using the mixed gas containing HBr and He, chlorine in a proportion of 50-150 vol. % as much as HBr may be added for about 3-15 seconds.

DESCRIPTION OF THE PREFERRED EMBODIMENTS

Embodiments of the present invention will hereinafter be described with reference to the accompanying drawings.

Figure 3:
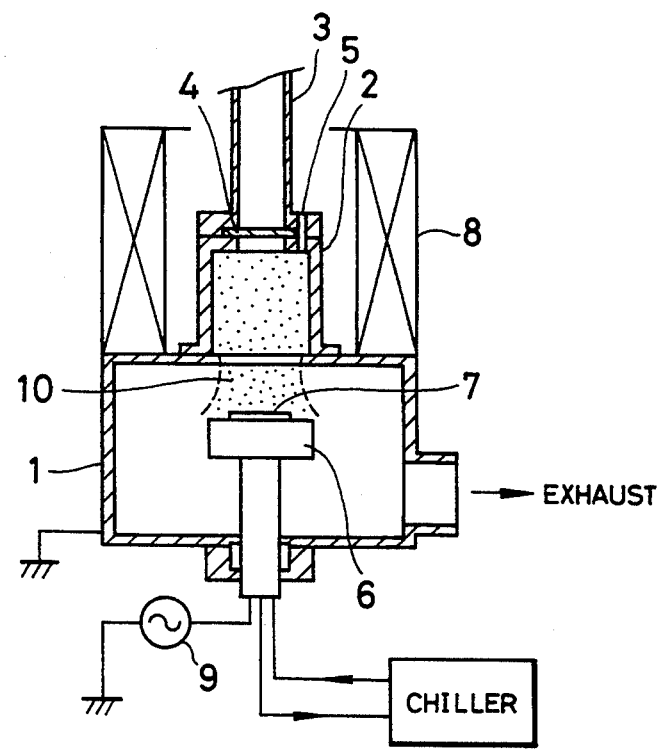
FIG. 3 is a cross-sectional view showing a basic construction of an ECR etching apparatus.

In a first method of the present invention, it is preferable to use an ECR etching apparatus as shown in FIG. 3. The ECR etching apparatus comprises a processing chamber 1 for accommodating a specimen which carries a predetermined SiO$_2$ mask and a polysilicon film on a silicon wafer; an ionization chamber 2 and a microwave waveguide 3, which are interconnected with each other. A quartz glass plate 4 is disposed between the ionization chamber 2 and the microwave waveguide 3. A gas introducing port 5 is open to the ionization chamber 2, and the processing chamber 1 is provided with a specimen carrier 6 for carrying a specimen 7 thereon. The ionization chamber 2 is surrounded by a main coil 8. The specimen carrier 6 is connected to a variable high frequency power source 9 (13.56 MHz) and also connected to a refrigerator for cooling the specimen by the circulation of a coolant. The processing chamber 1 is provided with an end point detecting apparatus for observing changes in the intensity of the wavelength of plasma light.

In the first method of the present invention, first, a silicon wafer specimen is located into the processing chamber 1 of the ECR etching apparatus. On the silicon wafer, a stepped $SiO_2$ film consisting of a thick $SiO_2$ film 16 and thin $SiO_2$ film 17, a polysilicon film 111, and predetermined masks 112, 212 are formed.

Figure 5:
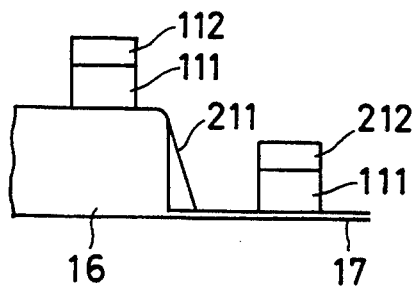
FIG. 5 is a cross-sectional view showing the shape of a polysilicon film, upon termination of the first process, on which a stringer remains.

Next, prior to the first process, the processing chamber 1 is evacuated to a pressure of about $10^{-5}-10^{-6}$ Torr. Then, the first process is started, wherein a mixed gas containing $Cl_2$ and HBr (chlorine occupies 50–70 vol. % of the total gas) is introduced into the processing chamber 1 at a pressure between $1\times10^{-4}-1\times10^{-2}$ Torr, and preferably at $7\times10^{-3}$ Torr, so that the pressure is not too low, and the specimen carrier is applied with an appropriate RF bias. Then, changes in the intensity of the wavelength of $SiCl_4$ are observed using an end point detecting apparatus of a type which, for example, tracks changes in the intensity of a particular wavelength of plasma light during etching. The first process is assumed to last until almost no intensity change is observed. After the termination of the first process, a polysilicon film 212 remains in a corner portion of a step on the specimen as shown in FIG. 5.

After evacuating the processing chamber 1, a mixed gas containing HBr and Hr (HBr occupies 20–50 vol. % of the total gas) is introduced into the processing chamber 1 a process gas for the second process. The pressure is set between $1\times10^{-2}$ and $3\times10^{-2}$ Torr, and preferably at about $1.5\times10^{-2}$ such that the pressure is not too low, and etching is carried out until the polysilicon film remaining on the step portion is completely removed. Reactions during this etch are believed to be the following:

$$Si + 2Cl_2 \rightarrow SiCl_4 \uparrow \qquad (1)$$

$$Si + 2Br_2 \rightarrow SiBr_4 \uparrow \qquad (2)$$

Here, $SiCl_4$ is evaporated and removed by a vacuum pump, whereas if the wafer surface is at a relatively low temperature of 50° C. or less, $SiBr_4$ attaches on the partially etched side wall and acts as a side wall protection film, whereby anisotropic etching is performed.

Figure 6:
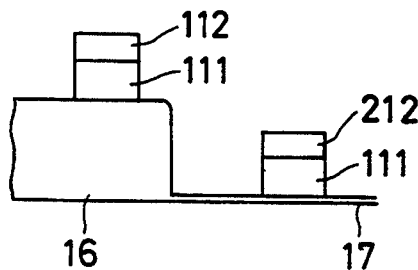
FIG. 6 is a cross-sectional view showing a polysilicon film on a SiO$_2$ after the second process which is free of stringer and has been anisotropically etched.

After the termination of the second process, on the specimen, the polysilicon film which was remaining on the corner portion of the step has completely been removed, as shown in FIG. 6.

Figure 1:
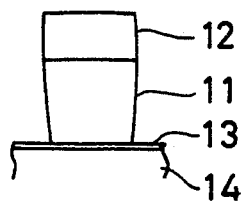
FIG. 1 is a cross-sectional view showing a polysilicon film on a SiO$_2$ film which was etched in a re-entrant profile shape.
Figure 2:
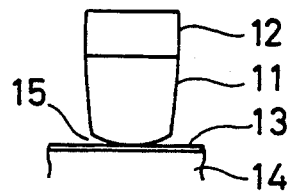
FIG. 2 is a cross-sectional view showing a polysilicon film on a SiO$_2$ film which present a re-entrant profile and a notch caused by etching.

In the first process, chlorine contained in the $Cl_2$/HBr mixed gas acts to improve the etching speed while HBr acts to enhance the anisotropic etching. Since the first process lasts for a period just necessary to remove the polysilicon film and expose the $SiO_2$ film, even if a process gas contains about 50–70 vol. % of chlorine, the re-entrant profile as shown in FIG. 1 or the notch 15 as shown in FIG. 2 will never occur.

In the second process, since over-etching is performed unlike the first process, the etching is performed with the mixed gas containing HBr and He without using chlorine which easily causes the re-entrant profile and notch. In this event, Br produces $SiBr_4$ and removes the polysilicon film remaining in the step portion, where part of $SiBr_4$ is thought to act as a side wall protection film.

Incidentally, it is thought that He assists the etching as well as acts for homogenization of the electric potential in plasma and consequently acts for homogenization of the etching speed on the surface of the specimen.

The gas pressure of the process gases in both the first and second processes is set so as not to be excessively high, that is, between $1\times10^{-4}$ and $1\times10^{-2}$ Torr and preferably at $7\times10^{-3}$ in the first process, and between $1\times10^{-2}$ and $3\times10^{-2}$ Torr and preferably at $1.5\times10^{-2}$ Torr in the second process, because the attachment of $SiBr_4$ on the etched side wall as a side wall protection film is facilitated.

Next, a second method of the present invention will be explained. It is preferable to use the ECR etching apparatus as shogun in FIG. 3 also in the second method. In the second method, a mixed gas containing HBr and He (HBr occupies 20–50 vol. % of the mixed gas) is used as a process gas for both the first and second processes. In the first process, with the process gas which is the mixed gas of HBr and He, the pressure in the processing chamber 1 is adjusted between $1\times10^{-4}$ and $1\times10^{-2}$ Torr and preferably to about $7\times10^{-3}$ Torr for example by restricting a flow rate through discharge port of the processing chamber 1 such that the pressure is not too low. The specimen carrier is applied with a bias voltage $V_{dc}$, for example, between $-250$ and $-100$ volts. Observing, for example, changes in the intensity of the wavelength of Si by the end point detecting apparatus, the first process lasts until substantially no intensity change is seen.

Next, with the plasma condition remaining unchanged, the bias voltage only is lowered to a value (for example, $V_{dc} = -100 - -30$ volts) at which ion energy does not damage the substrate, and etching lasts until a polysilicon film in a step portion is completely removed. The bias voltage applied in the second process is properly determined within the foregoing range in consideration that the bias voltage is within a range in which the substrate is not damaged; the selectivity ratio of the polysilicon film to an underlying thermally oxidized film ($SiO_2$) of 200 Angstroms or less in thickness (etching speed of the polysilicon film/etching speed of the thermally oxidized film) is sufficiently large; the thermally oxidized film sufficiently remains after over-etching has been performed for removing stringer; and anisotropic etching of the polysilicon film and the etching speed are in the best possible condition.

Main etching reactions are estimated to be equal to those expressed by the foregoing two chemical formulae. Here, if the wafer surface is at a low temperature of about 50° C. or less, part of $SiBr_4$ attaches on an etched side wall and acts as a side wall protection film, whereby anisotropic etching is carried out. The rest of $SiBr_4$ is sucked and removed by a vacuum pump.

He assists the etching by a sputtering effect as well as acts for homogenization of the etching speed on the whole surface.

Further, the bias voltage is set to a high value in the first process because a naturally oxidized film on the polysilicon film is easily removed, the etching speed is increased, and the anisotropic etching is improved. The pressure in the processing chamber 1 is set between $1\times10^{-4}$ and $1\times10^{-2}$ Torr and preferably at $7\times10^{-3}$ in the first process, and between $1\times10^{-2}$ and $3\times10^{-2}$ Torr and preferably at $1.5\times10^{-2}$ Torr in the second process, such that the pressure is not too low in both the first and second processes, because the deposition of $SiBr_4$ on the etched side wall as a side wall protection film is facilitated.

Figure 4:
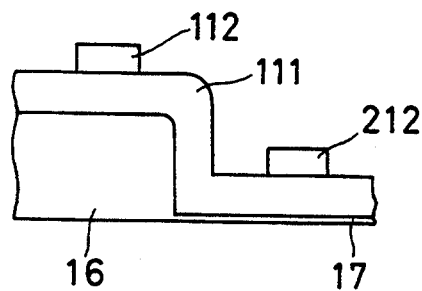
FIG. 4 is a cross-sectional view showing the shape of a stepped polysilicon film before etching.

FIG. 4 shows an example of a polysilicon film 111 deposited along a step portion over upper level SiO$_2$ film 16 and lower level SiO$_2$ films 17 by CVD (Chemical Vapor Deposition) or the like. Masks 112, 212 are made of SiO$_2$.

Specific Example

FIG. 4 shows a cross-sectional view of a silicon wafer specimen before etching, and a cross-sectional view as shown in FIG. 5 is seen after the first process has been terminated. In FIG. 5, the polysilicon film 211 remains in a corner portion of the step. This is generally called a stringer. The stringer, if remains there, causes electric short-circuit with the adjacent polysilicon line and results in defect, so that it must be completely removed. FIG. 6 shows a cross-section of the specimen after the second process, where the stringer has been completely removed. The foregoing is achieved using the first and second methods of the present invention.

In the first process of the first method of the present invention, the processing chamber is once evacuated to $1 \times 10^{-6}$ Torr, and thereafter Cl$_3$:30SCCM and HBr:15SCCM are introduced from the gas introducing port 5 of the ionization chamber 2 through a mass flow controller, not shown. Afterward, while a magnetic field of 875 Gauss is generated in the ionization chamber 2 by the main coil 8, a microwave at 2.45 GHz is introduced from the microwave waveguide 3 to create ECR (Electronic Cyclone Resonance) conditions, and a plasma flux 10 is emitted to irradiate a specimen 7 on the specimen carrier 6. In this event, for the purpose of improving the anisotropic etching and the etching speed, the specimen carrier 6 is applied with a bias voltage using the high frequency power source 9. The voltage at this time is selected to be $-150$ volts. During the first process, changes in wavelength intensity of a SiCl$_4$ plasma beam are observed by the end point detecting apparatus. When the intensity suddenly drops and then becomes substantially constant (a substantially horizontal line is seen on a display), the application of the bias voltage is stopped, and the processing chamber is evacuated. The end point detecting apparatus is constructed to divide beam from reactive gases, reaction products, thin films to be etched and so on according to wavelength; continuously measure the wavelengths to find one whose beam emission intensity suddenly changes at the end point of etching; display such a sudden change on the display; and generate a signal indicative of the end point. In this example, since substantially no polysilicon film remains after the termination of the first process, the generation of SiCl$_4$ is suddenly decreased and accordingly the intensity of beam emitted therefrom also become weak suddenly, so that the end point was determined from this change.

When the pressure is lowered to about $1 \times 10^{-5}$ Torr, HBr:30SCCM and He:90SCCM are introduced as a process gas for the second process into the ionization chamber through the mass flow controller, and etching is performed. During this etching, a thin portion 17 of the oxide film must be prevented from falling out, so that a bias voltage applied to the specimen carrier is set to a lower value, for example, $-70$ volts. Then, etching is performed until the stringer 211 (see FIG. 5) is removed. Since the stringer is small, the end point cannot be clearly detected. However, since the end point of the first process can be very clearly detected, the end point of the second process may be selected by a timer.

In the second method of the present invention, after the processing chamber is once evacuated to $1 \times 10^{-5}$ Torr, HBr:30SCCM and He:90SCCM are introduced, in the first process, into the ionization chamber from the gas introducing port 5 through a mass flow controller, not shown. Thereafter, a magnetic field of 875 Gauss is generated in the ionization chamber by the main coil 8, while a microwave at 2.45 GHz is introduced from the microwave waveguide 3 to create ECR (Electronic Cyclone Resonance) conditions, and a plasma flux 10 is emitted to irradiate a specimen 7 on the specimen carrier 6. In this event, for the purpose of improving the anisotropic etching and the etching speed, the specimen carrier 6 is applied with a bias voltage of $-150$ volts using the high frequency power source 9.

During the first process, changes in wavelength intensity of a SiCl$_4$ plasma beam, for example, are observed by the end point detecting apparatus. When the intensity suddenly drops and then becomes substantially constant (a substantially horizontal line is seen on a display), the bias voltage is lowered to $-70$ volts for the second process. Then, etching lasts until a stringer, that is, the polysilicon film 211 in the step portion (see FIG. 5) is completely removed.

At the beginning of the etching with the mixed gas containing HBr and He in the first process, if chlorine of an amount equal to 50-150 vol. % as much as HBr is added for about 3-15 seconds, the etching speed and the anisotropic etching in the first process are further improved.

According to the first method of the present invention, a mixed gas containing Cl$_2$ and HBr is used as a process gas for the first process to increase the etching speed, however an amount of chlorine is restricted within certain range so that the etching is performed just to a necessary degree, defects such as re-entrant and notch, caused by chlorine, will not occur. As a process gas for the second process, a mixed gas containing HBr and He is used. Since HBr is less active than chlorine, there is no fear of producing notches, thereby eliminating crucial defects. Also, since the pressure is adjusted so that SiBr$_4$ produces a side wall protection effect, anisotropic etching is satisfactorily achieved even during over-etching for removing stringers, and no defect such as notch occurs.

According to the second method of the present invention, a mixed gas containing HBr and He, which is less active than chlorine and does not cause notches, is used as a process gas. In addition, if the pressure during etching is adjusted, a side wall protection by a reaction product or SiBr$_4$ is also provided, so that anisotropic etching is satisfactorily achieved even during over-etching for removing stringers, and no defect such as notch occurs.

It should be noted that in the second method, the same process gas is used in both the first and second processes, so that a time necessary to evacuate the process gas used in the first process does not exist prior to entering the second process, unlike the case where different gases are used in respective processes, whereby the entire cycle period can be reduced by about one minute, and accordingly the productivity is improved.

Further, according to the first and second methods, since the processes are performed utilizing the ECR etching method and the microwave plasma etching method which can control the generation of plasma and the application of a bias voltage to the specimen carrier independently of each other, the selectivity ratio (ratio of etching speed of polysilicon to that of SiO$_2$) can be infinitely increased, for example, by lowering the bias voltage applied to the specimen carrier. In other words, it is possible to create a condition in which a polysilicon film is etched but SiO$_2$ is not. Therefore, even if an underlying SiO$_2$ film is used in thickness of about 100 Angstrom in future, this SiO$_2$ film will not fall out by over-etching.

What is claimed is:

1. A plasma etching method of etching a polysilicon film specimen, comprising:
    a first process step in which a mixed gas comprising HBr and He is used as a process gas for etching, said HBr occupying 20–50 vol. % of said mixed gas, and a first bias voltage is applied to said polysilicon film specimen; and
    a second process step in which a mixed gas comprising HBr and He is used as the process gas for etching, said HBr occupying 20–50 vol. % of said mixed gas, and a second bias voltage lower than said first bias voltage is applied to said polysilicon film specimen.

2. A plasma etching method according to claim 1, wherein said first bias voltage ranges from −250 to −100 volts, and said second bias voltage ranges from −100 to −30 volts.

3. A plasma etching method according to claim 1, further comprising adding Cl$_2$ at the beginning of said first process step.

4. A plasma etching method according to claim 3, wherein the Cl$_2$ is added for a time of 3–15 seconds at an amount of 50–150 vol. % as much as HBr.

5. A plasma etching method of etching a polysilicon film specimen, comprising:
    a first process step in which a mixed gas comprising HBr and Cl$_2$ is used as said process gas for etching, said Cl$_2$ occupying 50–70 vol. % of said mixed gas, and a first bias voltage is applied to said polysilicon film specimen; and
    a second process step in which a mixed gas comprising HBr and He is used as the process gas for etching, said HBr occupying 20–50 vol. % of said mixed gas, and a second bias voltage lower than said first bias voltage is applied to said polysilicon film specimen.

6. A plasma etching method according to claim 5, wherein the second bias voltage ranges from −100 to −30 volts.

* * * * *